(12) United States Patent
Hobart et al.

(10) Patent No.: US 10,424,643 B2
(45) Date of Patent: Sep. 24, 2019

(54) DIAMOND AIR BRIDGE FOR THERMAL MANAGEMENT OF HIGH POWER DEVICES

(71) Applicant: The Government of the United States of America, as represented by the Secretary of the Navy, Arlington, VA (US)

(72) Inventors: Karl D. Hobart, Alexandria, VA (US); Andrew D. Koehler, Alexandria, VA (US); Francis J. Kub, Arnold, MD (US); Travis J. Anderson, Alexandria, VA (US); Tatyana I. Feygelson, Springfield, VA (US); Marko J. Tadjer, Springfield, VA (US); Lunet E. Luna, Wheaton, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/391,342

(22) Filed: Apr. 23, 2019

(65) Prior Publication Data

US 2019/0252501 A1    Aug. 15, 2019

Related U.S. Application Data

(63) Continuation of application No. 15/945,803, filed on Apr. 5, 2018, now Pat. No. 10,312,175.
(Continued)

(51) Int. Cl.
*H01L 29/16* (2006.01)
*H01L 29/45* (2006.01)
(Continued)

(52) U.S. Cl.
CPC ...... *H01L 29/1602* (2013.01); *H01L 29/4232* (2013.01); *H01L 29/45* (2013.01); *H01L 29/66462* (2013.01); *H01L 29/7786* (2013.01)

(58) Field of Classification Search
CPC .................................................. H01L 23/3732
See application file for complete search history.

(56) References Cited

U.S. PATENT DOCUMENTS 4,972,250 A * 11/1990 Omori ................ H01L 23/298
257/276
8,039,301 B2  10/2011 Kub et al.
(Continued)

FOREIGN PATENT DOCUMENTS

JP    08115898        5/1996
JP    2012028056      2/2012

OTHER PUBLICATIONS

Search Report and Written Opinion dated Jul. 26, 2018 in corresponding International Application No. PCT/US2018/026178.

*Primary Examiner* — Raj R Gupta
(74) *Attorney, Agent, or Firm* — US Naval Research Laboratory; Joslyn Barritt

(57) ABSTRACT

A device structure and method for improving thermal management in highly scaled, high power electronic and optoelectronic devices such as GaN FET and AlGaN/GaN HEMT devices by implementing diamond air bridges into such devices to remove waste heat. The diamond air bridge can be formed from a polycrystalline diamond material layer which can be grown on the surface of a dielectric material layer, on the surface of a III-nitride material, or on the surface of a diamond polycrystalline nucleation layer, and may be optimized to have a high thermal conductivity at the growth interface with the underlying material.

9 Claims, 20 Drawing Sheets

Related U.S. Application Data

(60) Provisional application No. 62/483,745, filed on Apr. 10, 2017.

(51) Int. Cl.
*H01L 29/423* (2006.01)
*H01L 29/778* (2006.01)
*H01L 29/66* (2006.01)

(56) References Cited

U.S. PATENT DOCUMENTS

| | | |
|---|---|---|
| 9,159,641 B2 | 10/2015 | Hobart et al. |
| 9,246,305 B1 | 1/2016 | Kub et al. |
| 9,305,858 B2 | 4/2016 | Hobart et al. |
| 9,331,163 B2 | 5/2016 | Koehler et al. |
| 9,466,684 B2 | 10/2016 | Koehler et al. |
| 2009/0146186 A1 | 6/2009 | Kub et al. |
| 2013/0228790 A1 | 9/2013 | Yamamura |
| 2014/0110722 A1* | 4/2014 | Kub .................. H01L 29/66462 257/77 |
| 2015/0054034 A1* | 2/2015 | Chiu .................. H01L 29/41758 257/194 |
| 2015/0060947 A1 | 3/2015 | Koehler et al. |
| 2017/0358670 A1* | 12/2017 | Kub .................... H01L 29/7786 |

* cited by examiner

Step 4

Step 5

Step 6

Step 1

Step 2

Step 3

"Gate first" process

"Gate last" process

Step 1

Step 2

Step 3

Step 4

Step 5

Step 6

Step 7

Step 8

Step 9

Step 4

Step 5

Step 6

Step 4

Step 5    609

Step 6    604

Step 7

Step 8

Step 1

Step 2

Step 3

Step 4

Step 5

US 10,424,643 B2

DIAMOND AIR BRIDGE FOR THERMAL MANAGEMENT OF HIGH POWER DEVICES

CROSS-REFERENCE

This Application is a Continuation of and claims the benefit of priority under 35 U.S.C. § 120 based on U.S. patent application Ser. No. 15/945,803 filed on Apr. 5, 2018, which in turn is a nonprovisional of and claims the benefit of priority under 35 U.S.C. § 119 based on U.S. Provisional Patent Application No. 62/483,745 filed on Apr. 10, 2017. The prior applications and all references cited herein are hereby incorporated by reference into the present disclosure in their entirety.

TECHNICAL FIELD

The present disclosure relates to High Electron Mobility Transistors (HEMTs), particularly to HEMTs having a diamond layer integrated therein to provide thermal management of the device.

BACKGROUND

The parasitic capacitance between the gate and drain and between the gate and source can significantly affect the efficiency of GaN-based High Electron Mobility Transistors (HEMT), especially at high frequencies. A key determinant of the capacitance of the gate to the drain, source and body is the thickness and dielectric constant of passivation materials in the gate to drain and gate to source regions. A passivation material layer with a lower dielectric constant will have lower gate to drain and gate to source capacitances.

The past several years have seen remarkable improvement in GaN-based High Electron Mobility Transistor (HEMT) technology. Much of this is due to improvements in material growth, device design and device fabrication. Despite significant improvements in power added efficiencies, it is becoming increasingly clear that GaN HEMTs designed for RF, microwave, millimeter wave, and power switching applications are severely limited by the ability to dissipate heat and thus must run at significantly reduced power levels, pulse length and duty cycle.

Recent thermal simulations indicate that the substrate is not the primary source of the thermal impedance, rather it is the ability of the III-nitride semiconductor material layers to locally spread the heat to the surrounding material and substrate due to the extraordinarily high power dissipation density in the near-channel device region (estimated at many megawatts) and the strong reduction in thermal conductivity with increasing temperature. Integrating the capability to locally spread the thermal power dissipated near the channel will have a large impact on overall device performance and allow significant total power output improvements.

Past methods to implement thermal management by depositing diamond on electronic devices resulted in additional adverse capacitance. For example, as described in U.S. Pat. No. 8,039,301 to Kub et al., "Gate After Diamond Transistor," the insulating diamond is positioned between the gate and the drain of a AlGaN/GaN High Electron Mobility Transistor (herein called a HEMT) to extract heat from the high power density area located adjacent to the gate. The diamond material has a dielectric constant of approximately 6 which, while low, results in an additional capacitive coupling between the gate and the drain resulting a loss of gain at high frequencies. See also U.S. Pat. No. 9,159,641 to Hobart et al., "Nanocrystalline diamond three-dimensional films in patterned semiconductor substrates"; U.S. Pat. No. 9,246,305 to Kub et al., "Light-emitting devices with integrated diamond"; U.S. Pat. No. 9,305,858 to Hobart et al., "Nanocrystalline diamond three-dimensional films in patterned semiconductor substrates"; U.S. Pat. No. 9,331,163 to Koehler et al., "Transistor with Diamond Gate"; and U.S. Pat. No. 9,466,684 to Koehler et al., "Transistor with Diamond Gate."

This problem becomes significantly more acute for very high frequency devices (transistors) because the gate-to-drain spacing is scaled down to achieve high transit time. However, simultaneously, the gate-to-drain capacitive coupling increases. Inserting a high dielectric constant material between the gate and drain in these highly scaled devices only increases the capacitive coupling resulting in loss of gain at high frequencies.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a device structure and method for improving thermal management in highly scaled, high power electronic and optoelectronic devices such as GaN Field Effect Transistor (FET) and more specifically, AlGaN/GaN HEMT (High Electron Mobility Transistor) devices, by implementing diamond air bridges into such devices to remove waste heat.

In accordance with the present invention, a diamond material layer is deposited on a sacrificial layer in a semiconductor heterostructure. The sacrificial layer is then removed, leaving the diamond material layer suspended as a diamond air bridge.

In many embodiments, the diamond material layer will be a nanocrystalline diamond material layer. The diamond material layer can be grown on the surface of a dielectric material layer, on the surface of a III-nitride material, or on the surface of a diamond nanocrystalline nucleation layer that is formed on the surface of the dielectric material layer or the III-nitride material surface, and may be optimized to have a high thermal conductivity at the growth interface with the underlying material.

In some embodiments, the diamond material layer is formed before the gate electrode is formed, while in other embodiments, the diamond material layer is formed afterwards.

In some embodiments, a passivation layer is deposited on the surface of the III-nitride material layer and the sacrificial layer is deposited on the passivation layer.

In some embodiments, a dielectric material layer is deposited on the passivation layer.

In some embodiments, a dielectric material layer is deposited on the diamond layer.

In some embodiments, a passivation layer is deposited on the dielectric material layer.

DETAILED DESCRIPTION

Figure 1A:
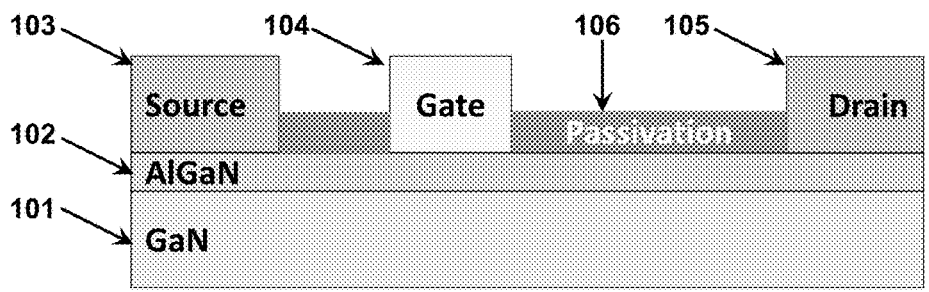
FIGS. 1A-1F are block schematics illustrating aspects of an exemplary embodiment of a HEMT having a diamond air bridge in accordance with the present disclosure.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a device structure and method for improving thermal management in highly scaled, high power electronic and optoelectronic devices such as GaN Field Effect Transistor (FET) and more specifically, AlGaN/GaN HEMT (High Electron Mobility Transistor) devices, by implementing diamond air bridges into such devices to remove waste heat.

In many embodiments, the diamond material layer will be a nanocrystalline diamond material layer. In some embodiments, the diamond material layer may have a thermal conductivity higher than about 300 W/mK, while in other embodiments, the diamond material layer may have a thermal conductivity higher than about 800 W/mK, higher than about 1200 W/mK, higher than about 1600 W/mK, higher than about 2000 W/mK, or higher than about 2300 W/mK.

Diamond has a dielectric constant of about 6, and so the diamond material layer not only has a high thermal conductivity, it may also be electrically insulating.

The diamond air bridge concept in accordance with the present invention significantly reduces capacitive coupling between the drain and the gate by suspending the diamond above the transistor. This results in low dielectric constant air (dielectric constant of 1) between the gate and the drain.

The implementation of the diamond air bridge in a high performance RF, microwave, or power switching transistor structures has many variations but primarily involves the deposition and patterning of a sacrificial layer (often herein referred to as "SL") prior to the deposition of the diamond film. The diamond material layer can be grown on the surface of a dielectric material layer, the III-nitride material surface, or on the surface of a diamond nanocrystalline nucleation layer that is formed on the surface of the first dielectric material layer or the III-nitride material surface, and may be optimized to have a high thermal conductivity at the growth interface with the underlying material.

This basic SL and diamond air bridge formation process can be implemented at any one of several points in any device fabrication sequence.

In some embodiments, the diamond material layer is formed before the gate electrode is formed, while in other embodiments, the diamond material layer is formed afterwards. In some embodiments, an optional diamond material layer is also formed after formation of the gate electrode.

In some embodiments, a dielectric material layer can be placed between the gate metal electrode and the AlGaN surface of an AlGaN/GaN HEMT. Such a dielectric layer should be optimized for the capability to have a low surface state density, low hot electron carrier trapping, high dielectric field strength, low transistor current collapse characteristics, low transistor dispersion characteristics. The dielectric layer should be sufficiently thin so that the thermal impedance from the semiconductor surface to the diamond heat-spreading layer is low.

The dielectric layer can be a composite dielectric layer consisting of one or more dielectric layers on the AlGaN or GaN surface grown using either in-situ or ex-situ growth techniques.

Whether in-situ or ex-situ, the dielectric layers will typically be from the group of silicon nitride, silicon oxide, aluminum nitride, or metal oxide with typical metal oxide layers being such thin film layers as aluminum oxide, hafnium oxide, lanthanum oxide, gadolinium oxide, or strontium oxide, or a composite dielectric consisting of combination of silicon nitride, silicon oxide and/or metal oxide. In addition, it will often be desirable that the dielectric be deposited using plasma techniques that have low ion energies so as to not damage the III-nitride surface to facilitate low current collapse and low dispersion in AlGaN/GaN HEMTs.

In-situ grown dielectric layers will typically be grown by a chemical vapor deposition (CVD), metal organic chemical vapor deposition (MOCVD), molecular beam Epitaxy (MBE), atomic layer deposition, atomic layer epitaxy, or plasma deposition technique.

Ex-situ dielectric layer deposition approaches include all of the commonly known thin film growth techniques but can also include new growth techniques such as atomic layer deposition, atomic layer epitaxy, plasma enhanced chemical vapor deposition, and chemical vapor deposition. An optional anneal at approximately 600° C. can be performed to increase the dielectric strength of the ex-situ deposited dielectric layer.

An example of a candidate first dielectric layer would be a 1 nm thick in-situ grown silicon nitride layer followed by the deposition of an ex-situ 3 nm thick metal oxide layer or aluminum nitride layer formed by an Atomic Layer Deposition (ALD) process. In the case that an in-situ silicon nitride layer is not used, it can be desirable to expose the AlGaN or GaN surface to a nitrogen, ammonia, or plasma nitrogen step to react nitrogen with the AlGaN or GaN surface to minimize nitrogen vacancies at the AlGaN or GaN surface.

The dielectric layer can also act as an insulating gate dielectric layer beneath a metal gate. In addition, it can protect the GaN or AlGaN surface from damage during diamond deposition process or from chemical decomposition during the growth of the diamond film. The growth environment for diamond typically includes a $CH/H_2$ gas mixture; these gases can decompose the GaN surface at typical diamond growth temperatures, and so a thin layer of silicon nitride or other dielectric material can protect the GaN surface during diamond growth.

In some embodiments, a diamond material layer may be deposited on the surface of the first dielectric layer, where the diamond layer may be in the form of a nanocrystalline diamond nucleation layer. The diamond deposition process typically uses the ultrasonic deposition of nanocrystalline diamond particles that act as a nucleation layer for diamond growth. The nanocrystalline diamond particles accelerated by ultrasonic energy can collide with the GaN surface causing mechanical damage if the first dielectric layer is not present.

Surface passivation of the device can be implemented before or after the formation of the gate electrode but in all cases passivation is necessary to provide device stability against current collapse due to trapping of electrons near the surface. Surface passivation materials include $Si_3N_4$ and AlN. The best surface passivation of GaN is typically obtained for silicon nitride layer deposited directly on GaN or AlGaN or AlN surface.

Various embodiments of a device structure incorporating a diamond air bridge and methods for fabricating the same will now be described in the context of the FIGURES submitted with and forming a part of the present disclosure. It will be noted that in the FIGURES and in the description below, like structural elements are numbered alike, with only the first numeral being changed to reflect the FIGURE which the element is depicted. For example, the diamond layer forming the diamond air bridge is referred to as element 108 in the discussion of the embodiment illustrated in FIGS. 1A-1F, element 208 in the discussion of the embodiment illustrated in FIGS. 2A-2H, element 308 in the discussion of the embodiment illustrated in FIGS. 4A-4H, etc. In addition, for the sake of brevity, elements introduced and described with respect to one FIGURE are not described in detail when they appear in subsequent FIGURES unless such description is needed for clarity. Moreover, although the devices and fabrication methods thereof are described below in the context of HEMT devices, particularly AlGaN/GaN HEMT devices, one skilled in the art will readily understand that the features and fabrication methods described herein may be easily modified to apply to other electronic devices, and application of the principles and aspects of diamond bridge formation to all such additional devices and fabrication methods is deemed to be within the scope of the present disclosure.

FIGS. 1A-1F illustrate aspects of a first embodiment of a semiconductor device structure having a diamond air bridge incorporated therein and a method for fabricating the same, where the device is an AlGaN/GaN HEMT in which the gate is formed prior to the diamond air bridge fabrication process.

The fabrication process starts at Step 1 shown in FIG. 1A, where an AlGaN/GaN HEMT comprising GaN buffer layer 101 and AlGaN barrier layer 102 is formed on a substrate (not shown). In the embodiment illustrated in FIGS. 1A-1F, passivation layer 106 is formed on an upper surface of AlGaN barrier layer 102, with source, gate, and drain electrodes 103, 104, and 105 being formed in patterned openings in the passivation layer. The source and drain electrodes can be formed from any suitable material such as titanium, aluminum, platinum, nickel, gold or layered combinations of those metals, while the gate electrode can comprise a metal nitride material layer, a refractory metal layer, an alloy metal layer, nickel, gold or a copper layer in contact with the surface of the III-nitride material in the case of AlGaN/GaN HEMTs.

Figure 1B:
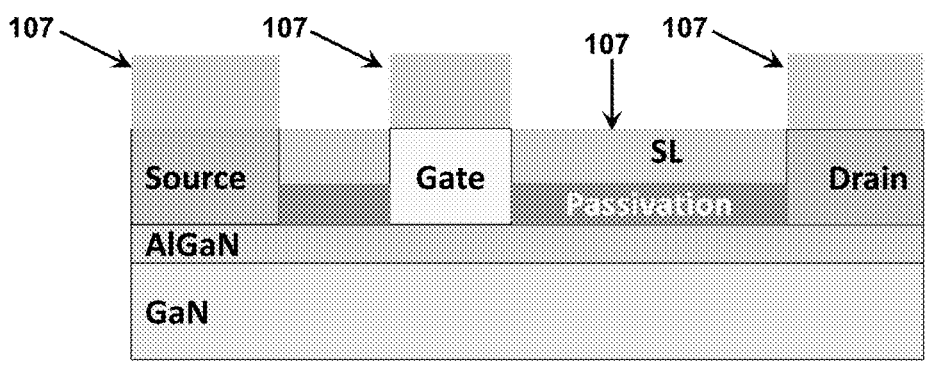
Figure 1C:
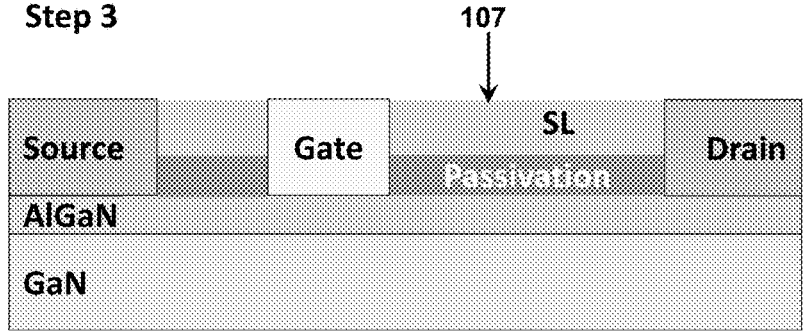

In Step 2 shown in FIG. 1B, a sacrificial layer (often referred to as simply "SL" as shown in the FIG. 107 is deposited on the passivation layer and source, gate, and drain electrodes. SL 106 can comprise any suitable material that can be wet or dry etched with high selectivity to the other materials. Candidate materials for the sacrificial layer are polycrystalline Si and amorphous $SiO_2$. In Step 3 shown in FIG. 1C, SL 107 is selectively etched so that the source, gate, and drain materials remain unaffected by the etching, with the result that SL 107 extends only between the source, gate, and drain electrodes, while upper surfaces of the source, gate, and drain are exposed. Such selective etching of SL 107 can be accomplished, e.g., using $XeF_2$ (for a polycrystalline sacrificial layer) or by vapor or anhydrous HF (for an amorphous $SiO_2$ sacrificial layer).

Figure 1D:
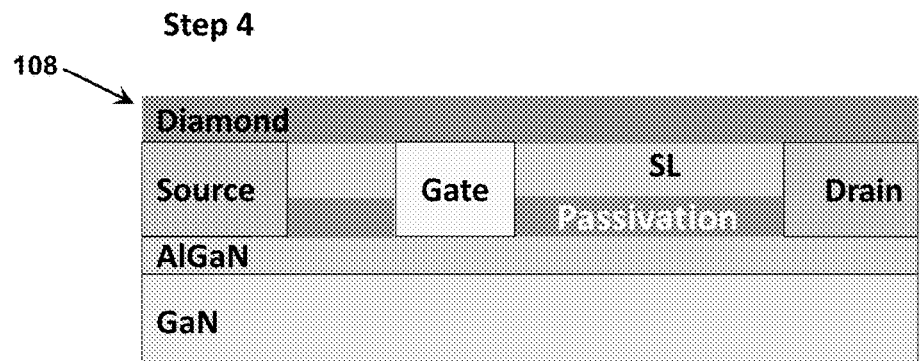

At Step 4 shown in FIG. 1D, diamond film 108 is deposited on the upper surface of the sacrificial layer and on the exposed upper surfaces of the source, gate, and drain. Diamond film 108 can be in the form of ultra-nanocrystalline diamond, nanocrystalline diamond, and polycrystalline diamond; can be grown by microwave assisted chemical vapor deposition or hot filament chemical vapor deposition from precursors including methane $CH_4$), hydrogen, nitrogen, argon, and diborane for p-type doping; and can be deposited at temperatures between 300 C and 900 C. In some cases, a diamond seed layer can be deposited prior to deposition of diamond film 108 to initiate growth of the diamond material.

Figure 1E:
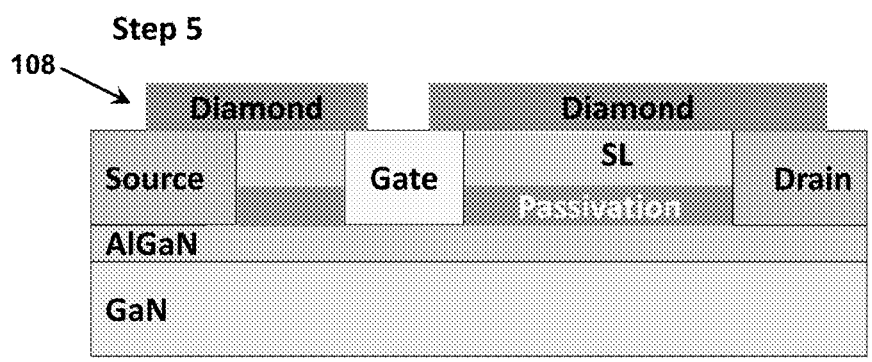

At Step 5 shown in FIG. 1E, diamond layer 108 is patterned, e.g., by etching, to expose portions of the source, gate, and drain electrodes so that electrical contact can be made to the device.

Figure 1F:
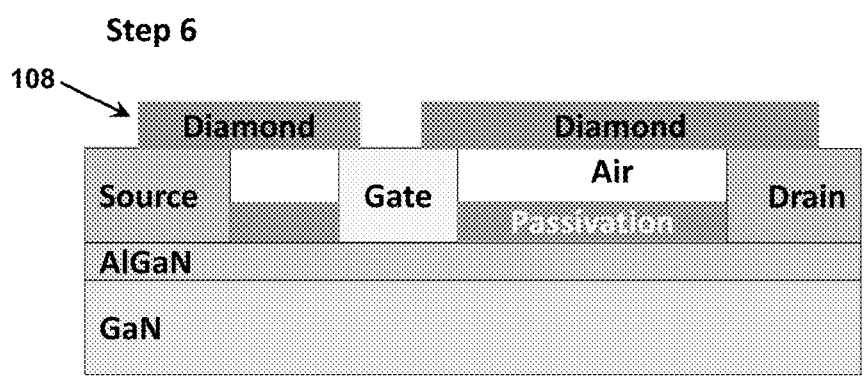

Finally, at Step 6 shown in FIG. 1F, SL 107 is removed, e.g., by etching, with diamond layer 108 remaining suspended above the passivation layer so as to form a diamond air bridge between the source and the gate and between the gate and the drain in the HEMT.

The block schematics in FIGS. 2A-2H depict aspects of another embodiment for fabricating a semiconductor device with a diamond air bridge in accordance with the present invention. In this embodiment, the same basic processing steps described above with respect to FIGS. 1A-1F are followed, except that the gate is formed after the sacrificial layer and the diamond layer are deposited but prior to the removal of the sacrificial layer. This implementation is useful when the gate electrode cannot tolerate the conditions present during the sacrificial layer or diamond deposition processes.

Fabrication of such a device starts with the formation of a basic device structure in Step 1, where the structure comprises an AlGaN/GaN HEMT having GaN buffer layer 201 and AlGaN barrier layer 202 and source and drain electrodes 204 and 205 formed on an upper surface of the AlGaN barrier layer. In addition, in this embodiment, passivation layer 206 is formed on an upper surface of the AlGaN barrier layer between the source and the drain. At Step 2 shown in FIG. 2B, SL 207 is formed on the passivation layer, and at Step 3, shown in FIG. 2C, diamond layer 208 is formed on an upper surface of the sacrificial layer, with diamond layer 208 extending laterally to cover the upper surface of the source and drain structures as well.

Figure 2A:
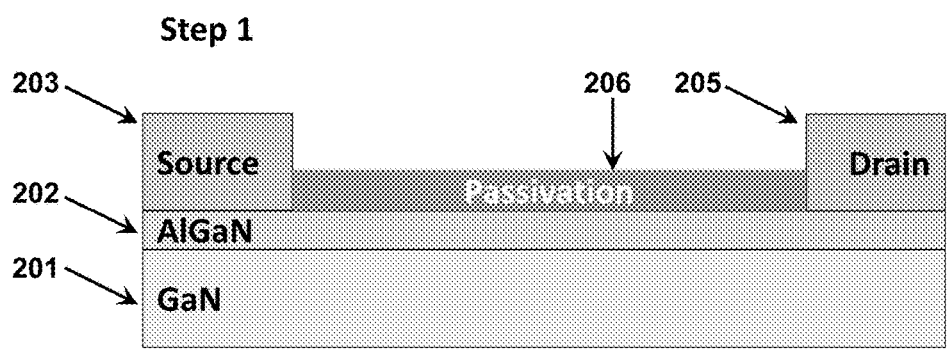
FIGS. 2A-2H are block schematics illustrating aspects of another exemplary embodiment of a HEMT having a diamond air bridge in accordance with the present disclosure.
Figure 2B:
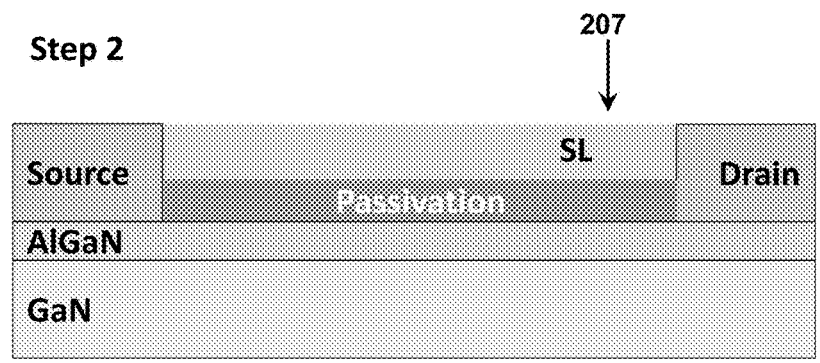
Figure 2C:
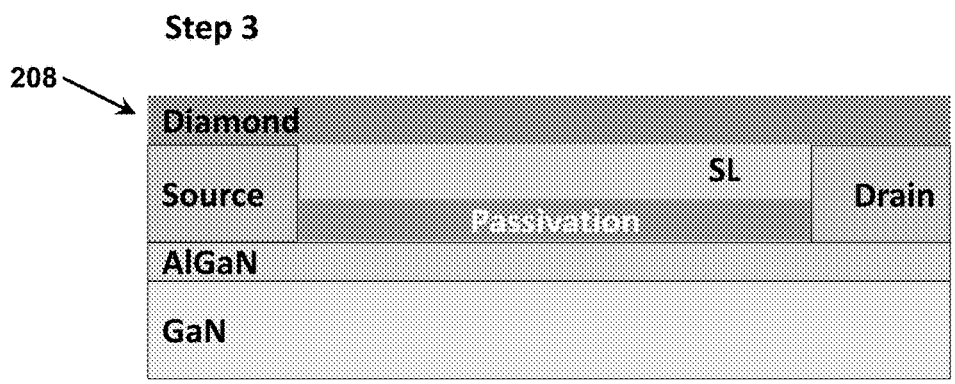
Figure 2D:
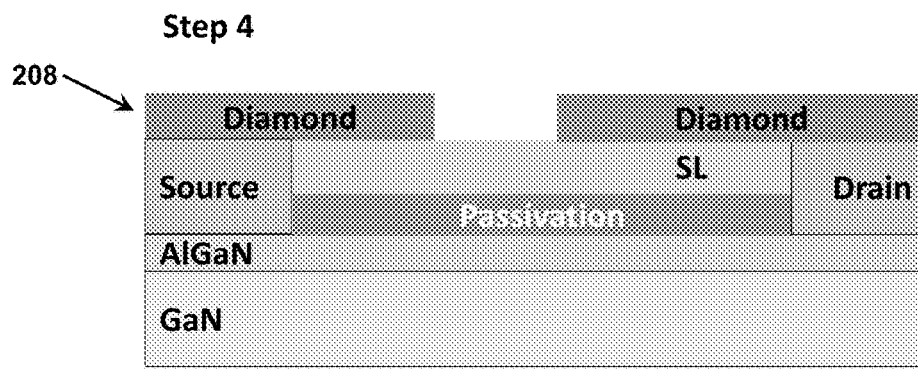
Figure 2E:
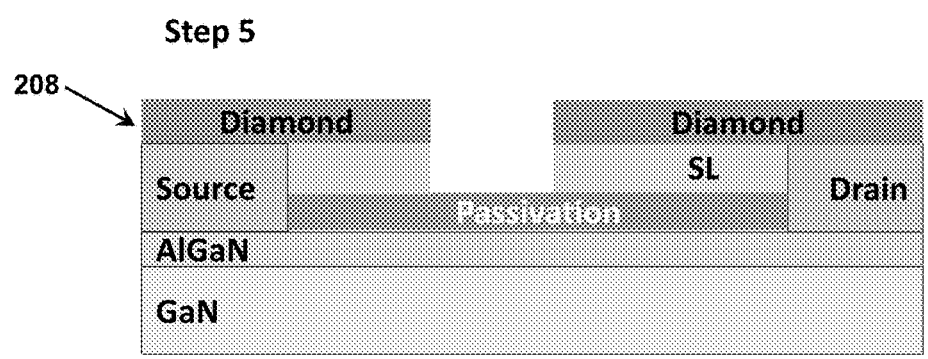
Figure 2F:
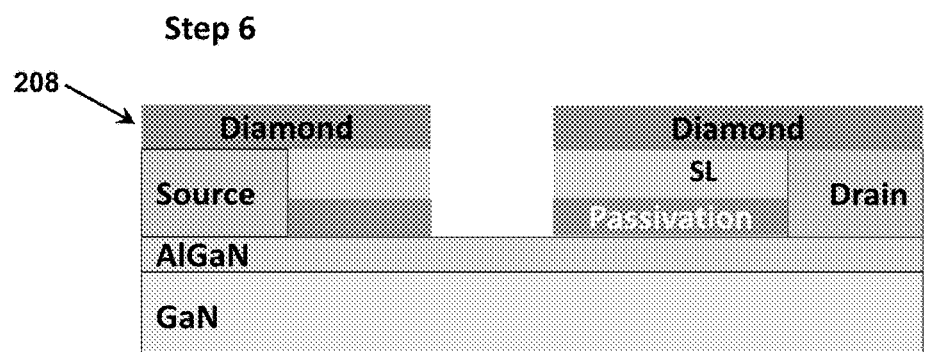
Figure 2G:
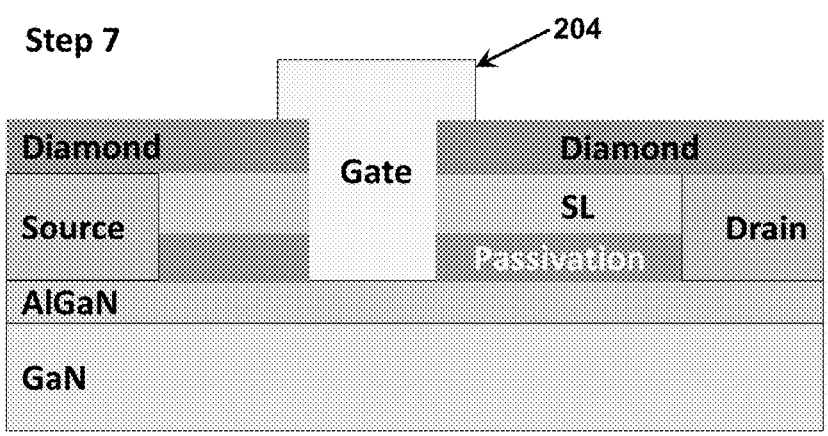
Figure 2H:
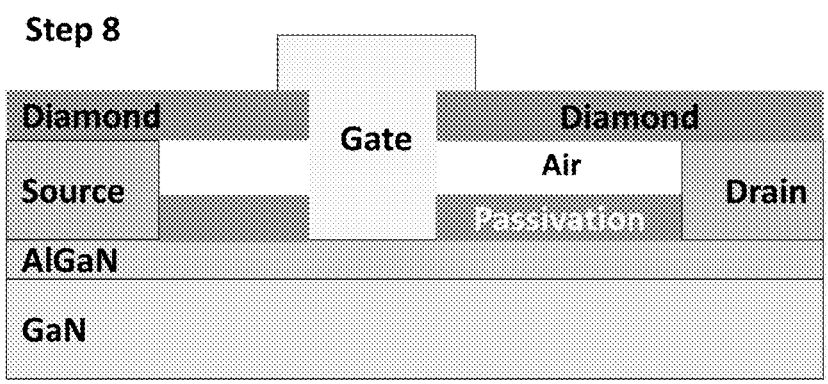

At Steps 4, 5, and 6 (FIGS. 2D, 2E, and 2F), the diamond layer, sacrificial layer, and passivation layers are patterned to form an opening for the formation of gate 204 in Step 7, which extends down to and contacts the AlGaN layer and extends laterally over the upper surface of the diamond layer, as shown in FIG. 2G. Finally, at Step 8 shown in FIG. 2H, the sacrificial layer is removed, e.g., by etching, with diamond layer 208 remaining suspended above the passivation layer so as to form a diamond air bridge between the source and the gate and between the gate and the drain in the HEMT.

Figure 3A:
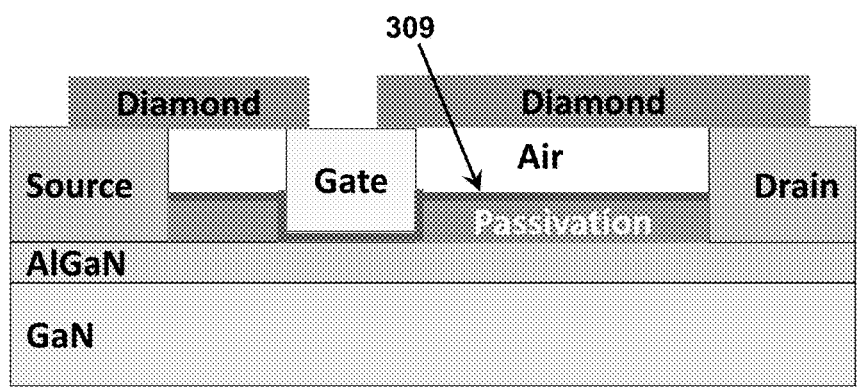
FIGS. 3A and 3B are block schematics illustrating additional aspects of the HEMTs depicted in FIGS. 1A-1F and FIGS. 2A-2H.
Figure 3B:
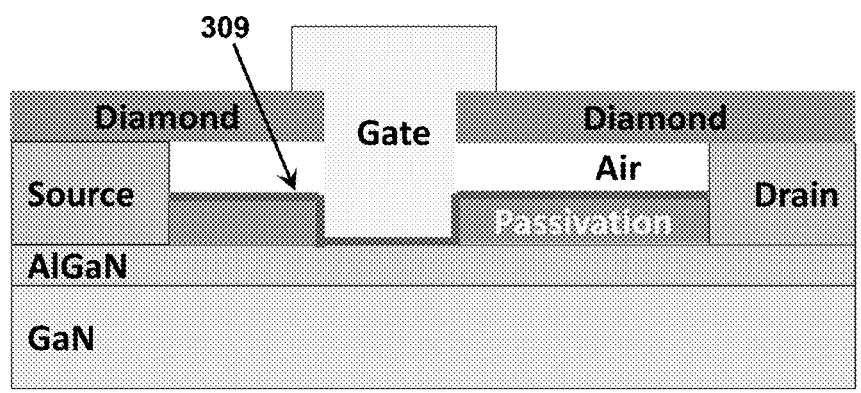

In both cases, either the "gate first" process or the "gate last" process, in some embodiments, a gate insulator dielectric layer can be deposited prior to the formation of the gate as shown in FIG. 3A ("gate first") or FIG. 3B ("gate last") to insulate the gate and reduce current leakage in the device. Any suitable insulating dielectric can be used, with $Al_2O_3$, $ZrO_2$, $SiO_2$, $Si_3N_4$, and $HfO_2$ being particularly suitable.

In another embodiment of a HEMT device having a diamond air bridge incorporated therein, the passivation, SL, and diamond layers are deposited first, followed by formation of the ohmic contact (source and drain) and gate electrodes.

The block schematics in FIGS. 4A-4H illustrate aspects of such a device and the fabrication process thereof.

Figure 4A:
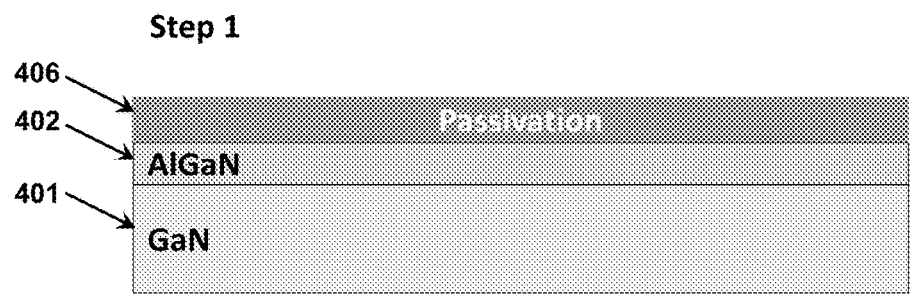
FIGS. 4A-4I are block schematics illustrating aspects of another exemplary embodiment of a HEMT having a diamond air bridge in accordance with the present disclosure.
Figure 4B:
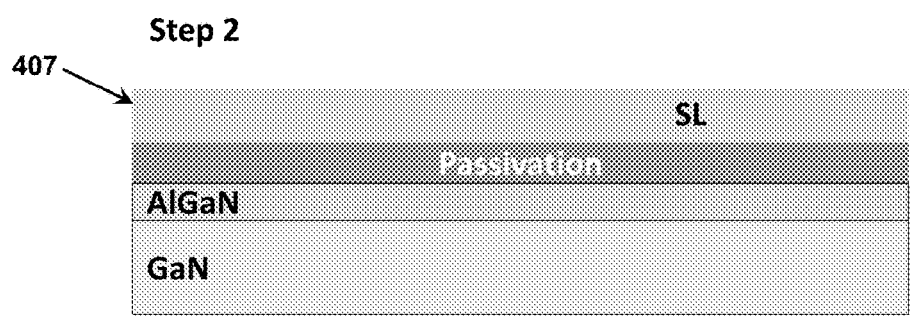
Figure 4C:
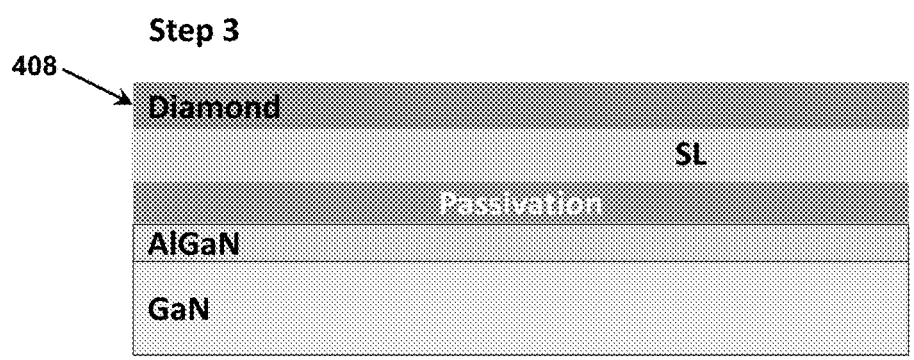

As shown in FIG. 4A, in Step 1, a basic HEMT structure is formed, comprising GaN buffer layer 401 and AlGaN barrier layer 402, with passivation layer 406 being formed on an upper surface of the AlGaN layer. At Step 2 shown in FIG. 4B, SL 407 is formed on an upper surface of the passivation layer and in Step 3 shown in FIG. 4C, diamond layer 408 is deposited on an upper surface of the sacrificial layer.

Figure 4D:
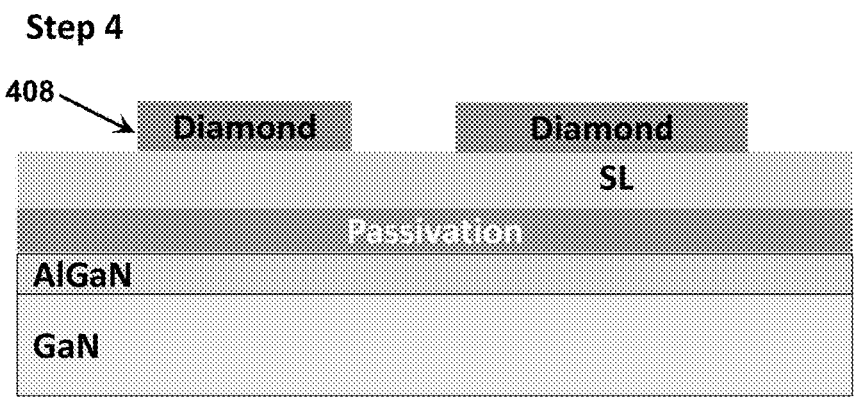
Figure 4E:
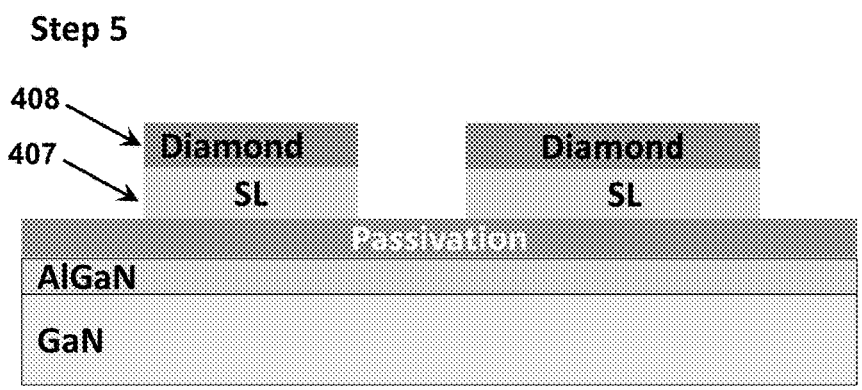
Figure 4F:
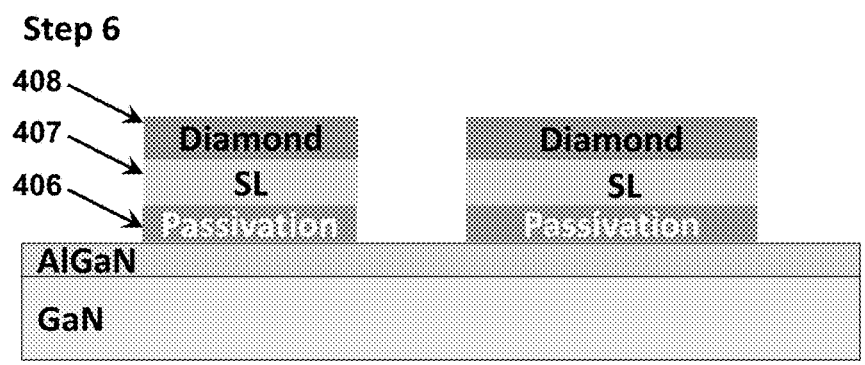
Figure 4G:
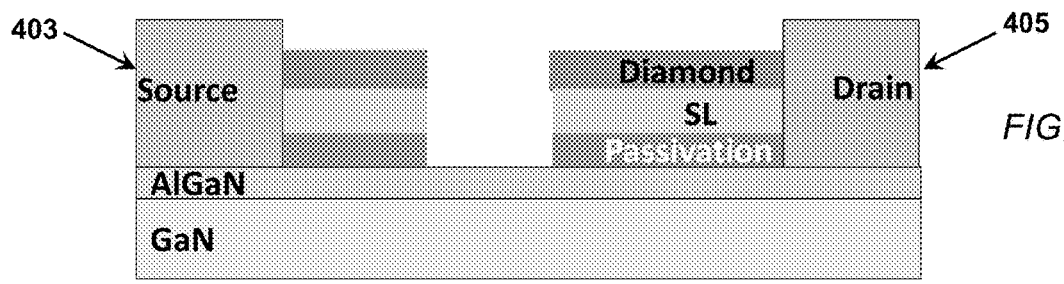
Figure 4H:
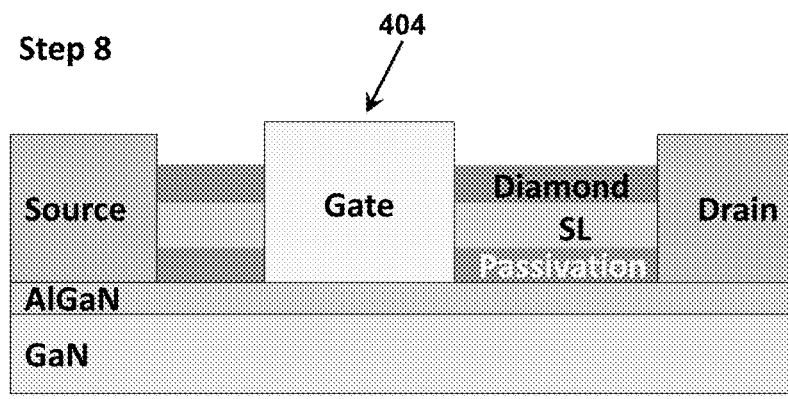
Figure 4I:
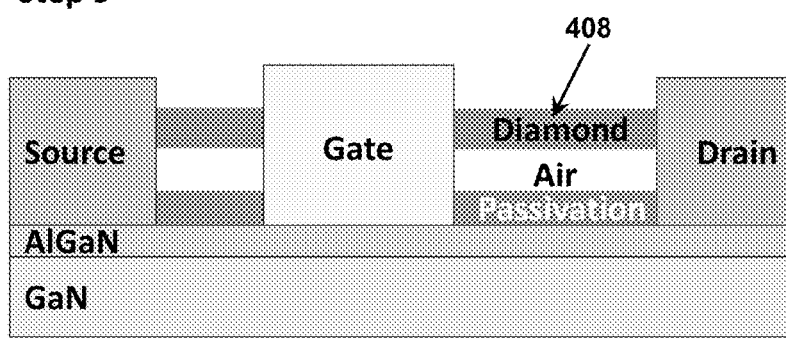

In Steps 4, 5, and 6 shown in FIGS. 4D, 4E, and 4F, the diamond layer, sacrificial layer, and passivation layer are etched to provide openings for the formation of the source and drain contacts 403/405 in Step 7 as shown in FIG. 4G and for formation of gate electrode 404 in Step 8 shown in FIG. 4H. Finally, in Step 9 shown in FIG. 4I, the sacrificial layer is removed, leaving suspended diamond air bridge 408 remaining above the passivation layer.

The block schematics shown in FIGS. 5A-5F illustrate a process where further reduction of the gate-to-drain capacitance is achieved by increasing the thickness of the SL to provide greater separation of the diamond layer from both the gate and the drain. Such a structure in accordance with this aspect of the present invention reduces the capacitive coupling between the gate and the drain, which improves device performance and efficiency.

Figure 5A:
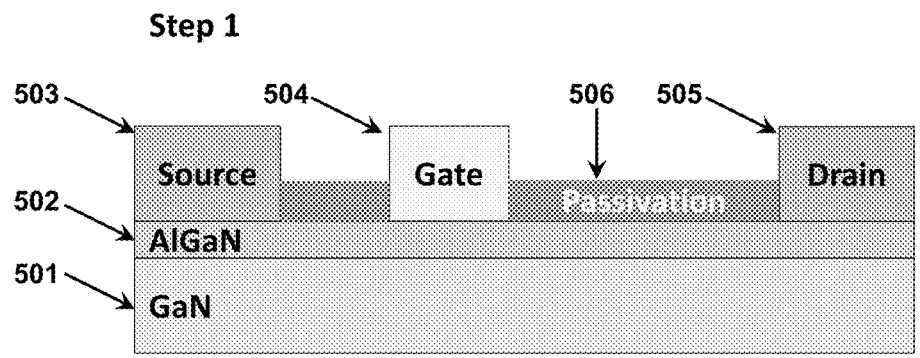
FIGS. 5A-5F are block schematics illustrating aspects of another exemplary embodiment of a HEMT having a diamond air bridge in accordance with the present disclosure.

Formation of a HEMT with a diamond air bridge in accordance with this embodiment of the present invention begins at Step 1 shown in FIG. 5A, where, as described above, an AlGaN/GaN HEMT comprising GaN buffer layer 501 and AlGaN barrier layer 502 is formed, with source, gate, and drain 503, 504, and 505 and passivation layer 506 formed on an upper surface of the AlGaN layer, where passivation layer 506 extends between the source and the gate and between the gate and the drain.

Figure 5B:
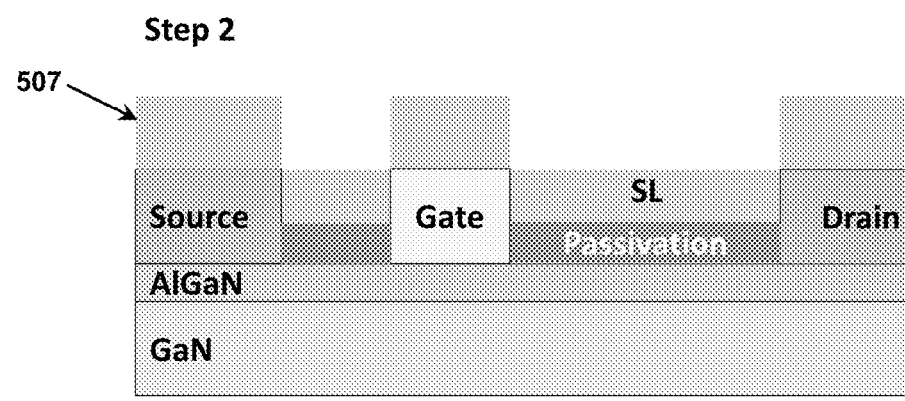
Figure 5C:
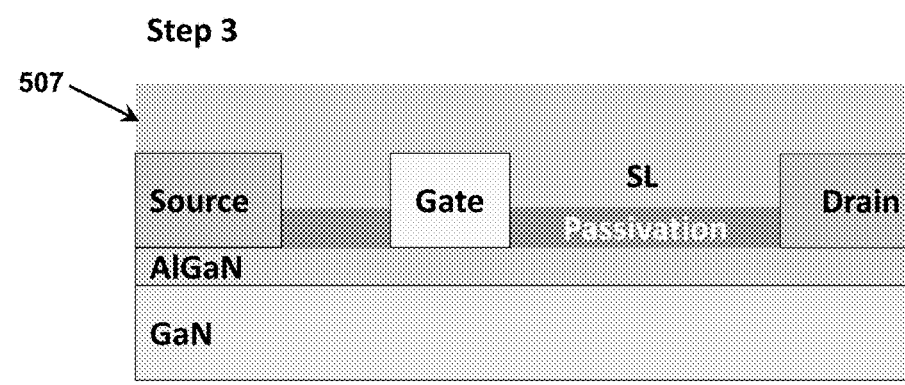
Figure 5D:
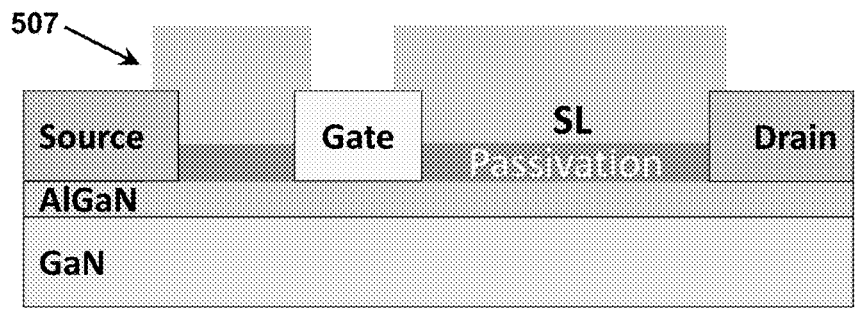

At Steps 2 and 3 shown in FIGS. 5B and 5C, SL 507 is deposited on an upper surface of the structure. In this embodiment, the sacrificial layer is deposited so as to cover the passivation layer between the source and the gate and between the gate and the drain, and further so as to cover the upper surfaces of the source, gate, and drain, with all of the passivation layer, the source, gate, and drain being covered with a thick sacrificial layer as shown in FIG. 5C. At step 4 shown in FIG. 5D, SL 507 is etched to provide exposed areas for electrical contact with the source, gate, and drain, leaving the remaining thick sacrificial layer in the unetched areas.

Figure 5E:
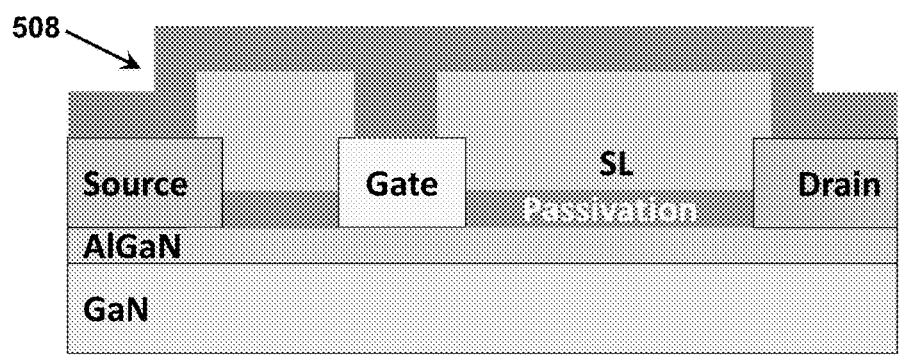

At Step 5 shown in FIG. 5E, diamond layer 508 is grown over all of the exposed surfaces in the device, including on the upper surfaces and sides of the source, gate, and drain and the upper surfaces of the thick SL.

Figure 5F:
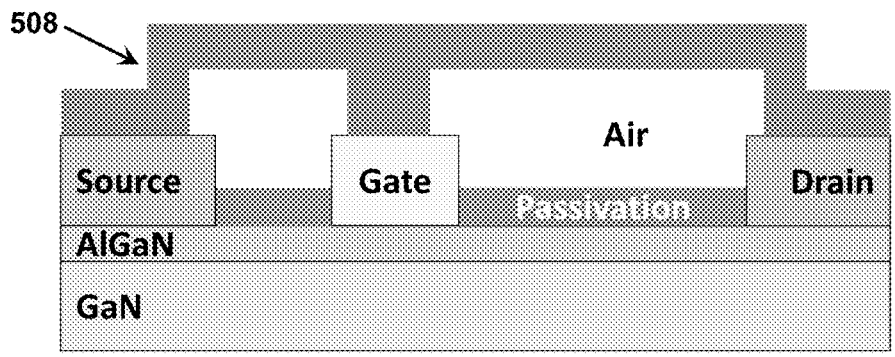

Finally, at Step 6 shown in FIG. 5F, the sacrificial layer is etched away to leave the suspended diamond air bridge above the passivation layer and portions of the source, gate, and drain, with other portions of the source, gate, and drain having the diamond layer in contact therewith to provide thermal management in those layers. As noted above, because of the thickness of the SL, the diamond air bridge in this embodiment of the present invention is suspended at a greater distance above the structure, particularly above the gate and the drain, which reduces the capacitive coupling between the gate and the drain in the device.

In another embodiment of a HEMT having a diamond air bridge in accordance with the present invention, aspects of which are shown by the block schematics in FIGS. 6A-6F, high regrown n+ epitaxial contacts are used to implement the source and drain in order to reduce the contact resistance.

Figure 6A:
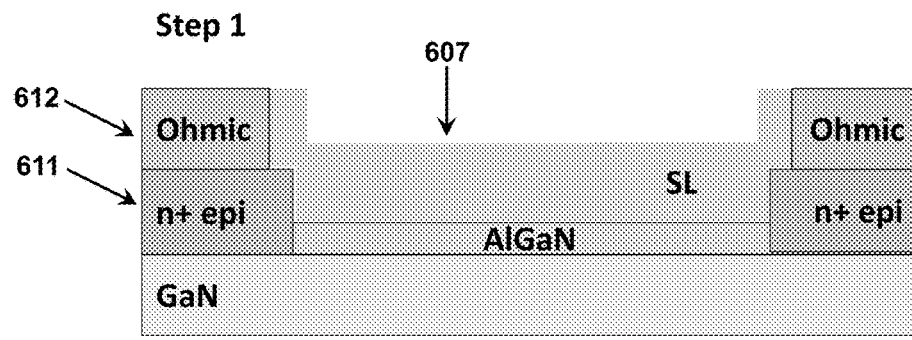
FIGS. 6A-6H are block schematics illustrating aspects of another exemplary embodiment of a HEMT having a diamond air bridge in accordance with the present disclosure.

Fabrication of such a device starts with Step 1 shown in FIG. 6A, in which an n+ epitaxial structure ("n+ epi") 611 is formed on an upper surface at each end of the AlGaN/GaN HEMT. In some embodiments, the n+ epi can be formed as a blanket layer and then be selectively etched away. In other embodiments, the surface of the transistor can be protected with a dielectric layer, with the n+ epi being selectively deposited in patterned openings in the dielectric layer. In either case, ohmic contacts 612 can be formed on the upper surface of each of the n+ epi structures. SL 607 is then deposited on the upper surface of the AlGaN layer and along the sides of the n+ epi and ohmic layers at the opposite ends of the AlGaN layer.

Figure 6B:
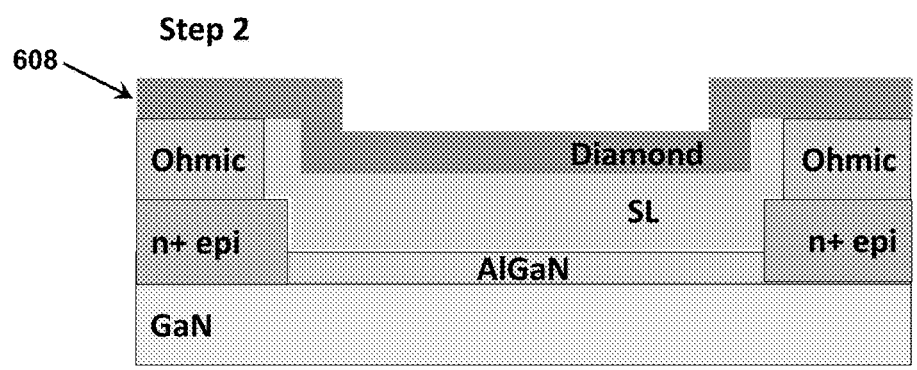
Figure 6C:
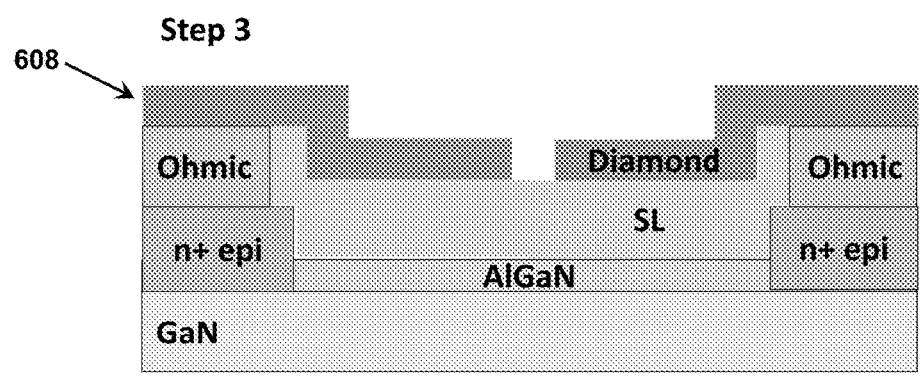
Figure 6D:
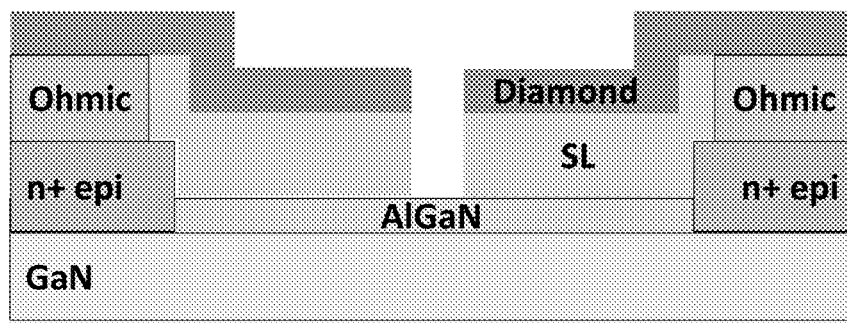

In Step 2 shown in FIG. 6B, diamond layer 608 is deposited on the upper surfaces of the ohmic layers and the sacrificial layer so as to cover all exposed upper surfaces of the device. At Steps 3 and 4 shown in FIGS. 6C and 6D, the diamond layer (FIG. 6C) and the sacrificial layer (FIG. 6D) are etched down to the AlGaN layer surface to provide a trench for formation of the gate.

Figure 6E:
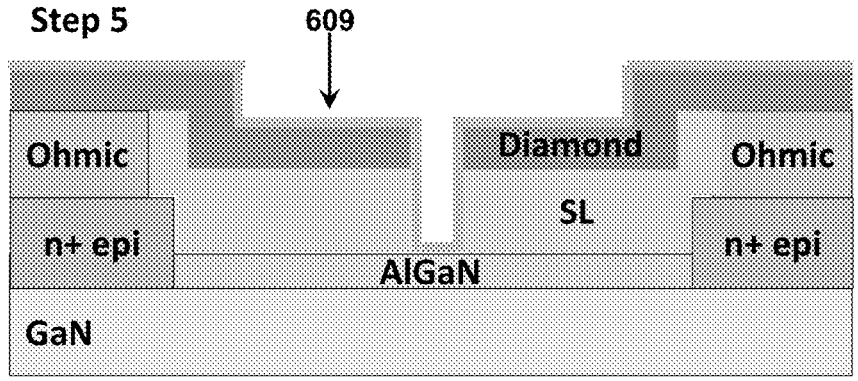
Figure 6F:
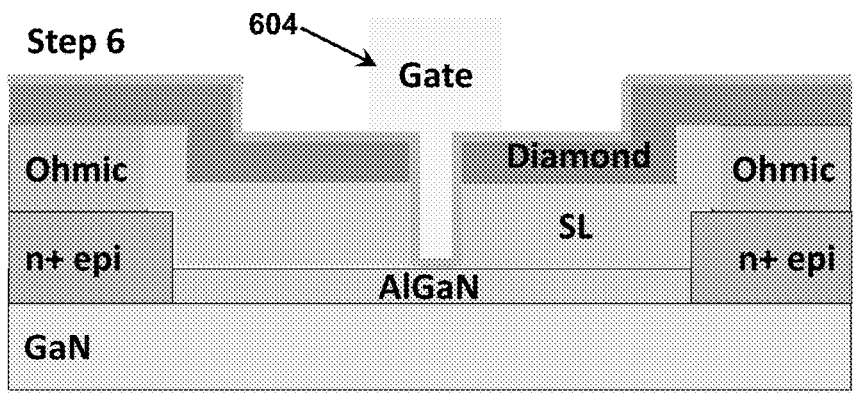

In step 5 shown in FIG. 6E, a dielectric layer 609 is deposited on the upper surface of the diamond layer, on the diamond and sacrificial layers along the sides of the trench, and on the upper surface of the AlGaN layer at the bottom of the trench so as to insulate gate 604 formed in Step 6 (FIG. 6F) from the AlGaN layer.

Figure 6G:
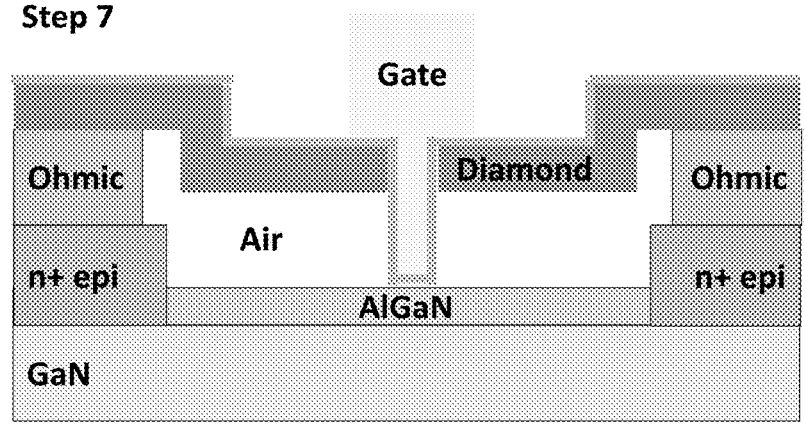
Figure 6H:
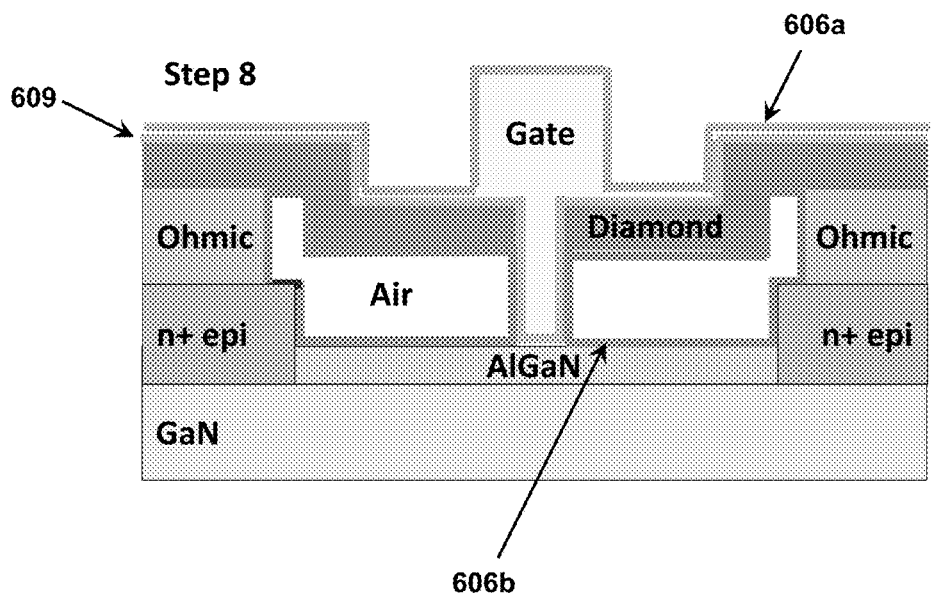

In Step 7 shown in FIG. 6G, the sacrificial layer is removed, leaving the diamond layer suspended between the ohmic layers and the trench on either side of the gate. Finally, in Step 8 shown in FIG. 6H, the device is passivated by deposition of passivation layer 606a on the upper surface of the dielectric layer and on the sides and upper surface of the gate and of passivation layer 606b on all exposed surfaces surrounding the air pockets produced by the removal of the SL. The passivation layer is needed to passivate the surface and specifically surface traps. The passivation layer can be deposited by any suitable means, such as atomic layer deposition (ALD) and can cover some or all of the surfaces in the device as appropriate. Thus, in the exemplary embodiment illustrated in FIG. 6H, passivation layer 606b is deposited by an ALD process which deposits the passivation layer on all surfaces of the device. It should be noted that in other cases, such as those illustrated in FIGS. 1A-1F, 2A-2H, 3A-3B, 4A-4I, and 5A-4F, the passivation layer can also be deposited by means of PECVD.

In another embodiment, aspects of which are shown in FIGS. 7A-7G, the diamond encases the gate, thereby providing improved thermal transport away from the gate.

Figure 7A:
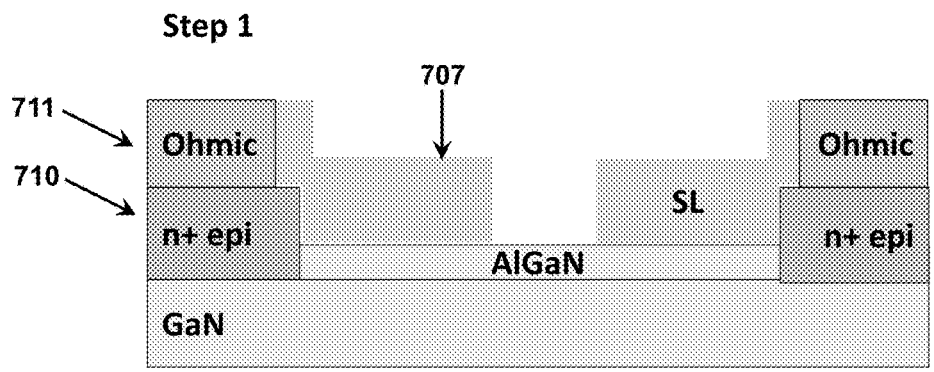
FIGS. 7A-7G are block schematics illustrating aspects of another exemplary embodiment of a HEMT having a diamond air bridge in accordance with the present disclosure.

The fabrication process of a device in accordance with this embodiment of the present invention includes Step 1 shown in FIG. 7A, wherein SL 707 is deposited on an AlGaN/GaN HEMT having an n+ epi layer 710 with ohmic layer. As shown in FIG. 7A, in this embodiment SL 707 is deposited at the ends of the AlGaN layer and on the sides of the n+ epi and ohmic layers, leaving a gap in the middle where the AlGaN layer is exposed.

Figure 7B:
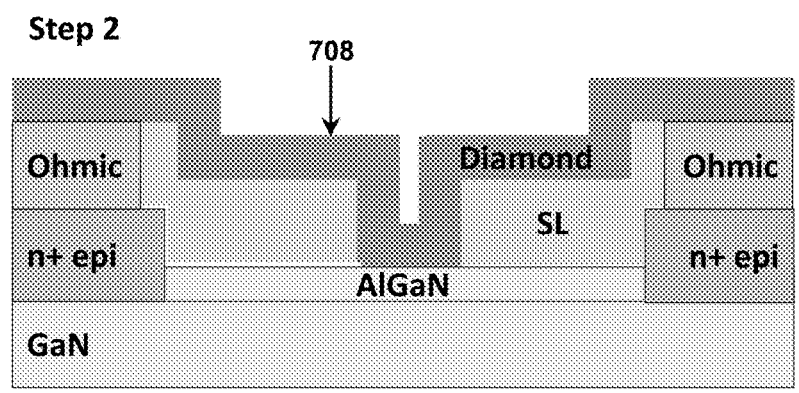
Figure 7C:
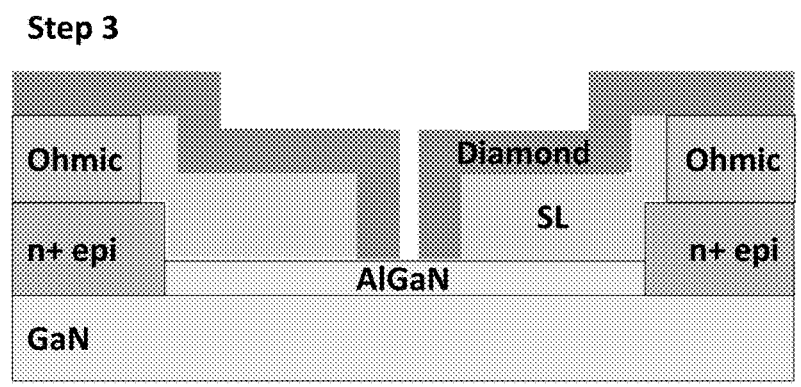
Figure 7D:
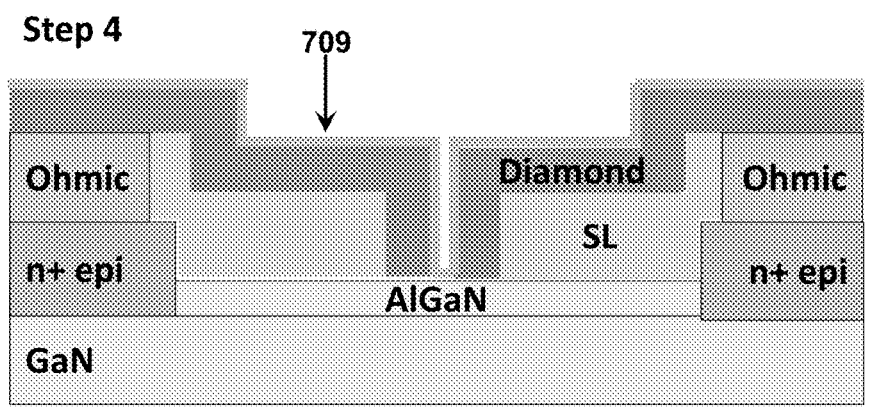
Figure 7E:
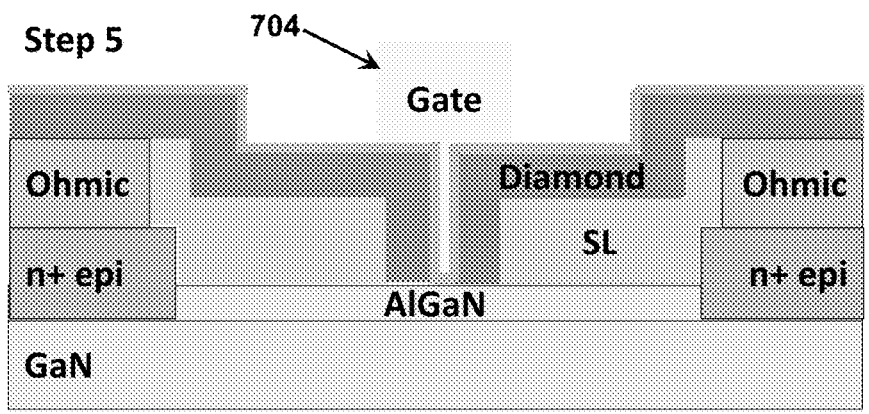

In Step 2 shown in FIG. 7B, diamond layer 708 is then deposited so as to cover the top of the ohmic contacts, the top and side surfaces of the sacrificial layer, and the exposed area of the AlGaN surface, with the diamond forming a trench along the sides of the sacrificial layer and the AlGaN surface, and at Step 3 shown in FIG. 7C, the diamond is removed from the bottom of this trench. In Step 4 shown in FIG. 7D, dielectric layer 709 is deposited on top of the diamond layer and along the sides and bottom of the trench, including on the upper surface of the exposed AlGaN layer. In Step 5 shown in FIG. 7E, gate 704 is formed in the trench so as to be both within the trench and extending above the upper surface of the dielectric layer, with the diamond and dielectric film encasing the lower portion of the gate.

Figure 7F:
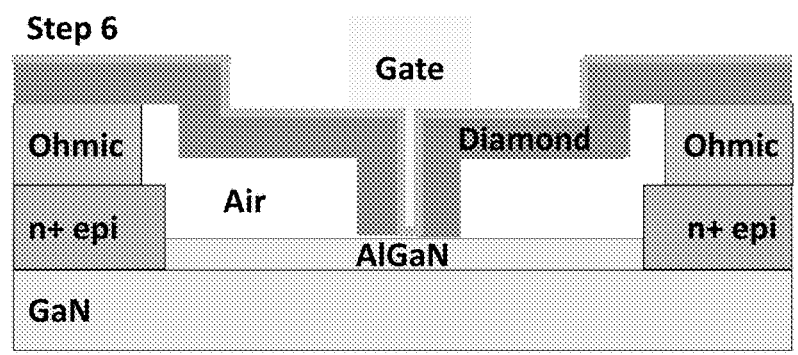
Figure 7G:
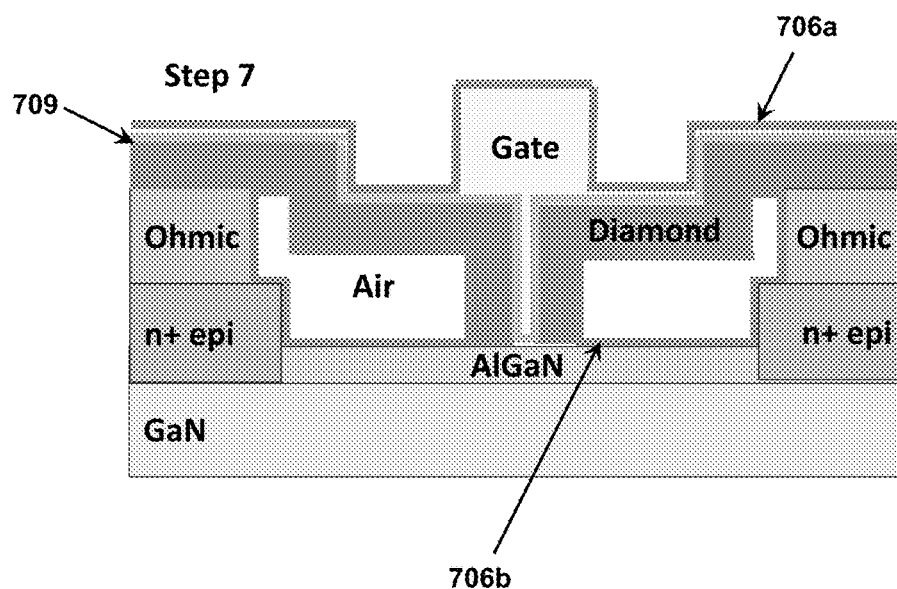

At Step 6 shown in FIG. 7F, the sacrificial layer is removed, leaving the diamond on the sides of the trench encapsulating the gate as well as being suspended over the AlGaN, with the encapsulated gate improving thermal coupling to the hottest portion of the device. Finally, at Step 7 shown in FIG. 7G, the device can be passivated by deposition of passivation layer 706a on top of dielectric layer 709 and passivation layer 706b on the inner surfaces of the diamond layer, AlGaN layer the n+ epi layers and the ohmic layers exposed after removal of the sacrificial layer around the encapsulated gate. This structure has the highest thermal coupling and also a narrow gate foot for higher frequency of operation.

FIGS. 8A-8D illustrate aspects of an additional embodiment of an AlGaN/GaN HEMT having a suspended diamond air bridge incorporated therein. Fabrication of such a device starts with Step 1 shown in FIG. 8A which depicts an AlGaN/GaN HEMT with n+ epi and ohmic contacts as described above with respect to FIG. 6A. In addition, the device structure formed in this Step 1 includes a passivation layer 806 formed on an upper surface of the AlGaN layer, the passivation layer being patterned to form a trench therein; dielectric layer 809 formed on an upper surface of the passivation layer and along the sides and bottom of the trench; and gate 804 formed as a t-gate in the trench and on an upper surface of the dielectric layer, where the gate is insulated from the AlGaN layer by the dielectric layer in the trench.

Figure 8A:
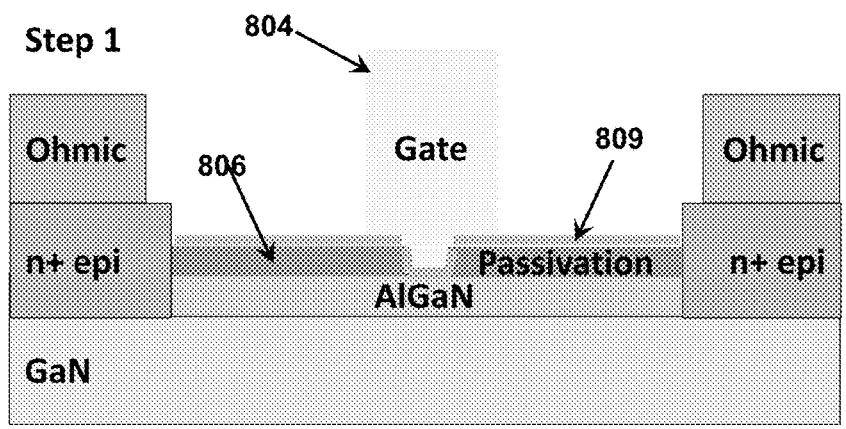
FIGS. 8A-8D are block schematics illustrating aspects of another exemplary embodiment of a HEMT having a diamond air bridge in accordance with the present disclosure.
Figure 8B:
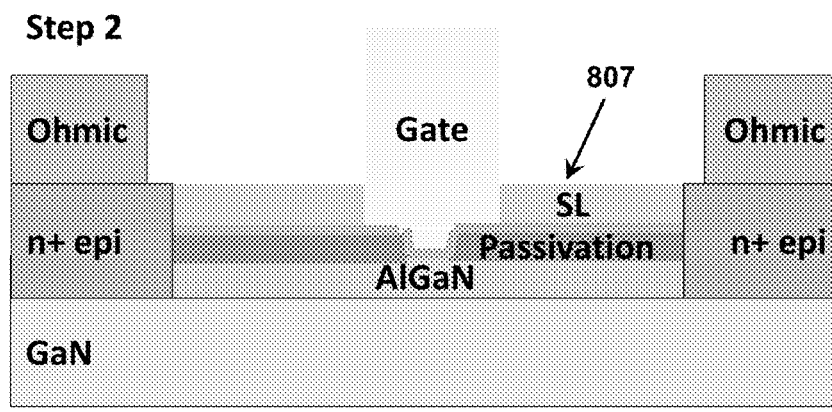
Figure 8C:
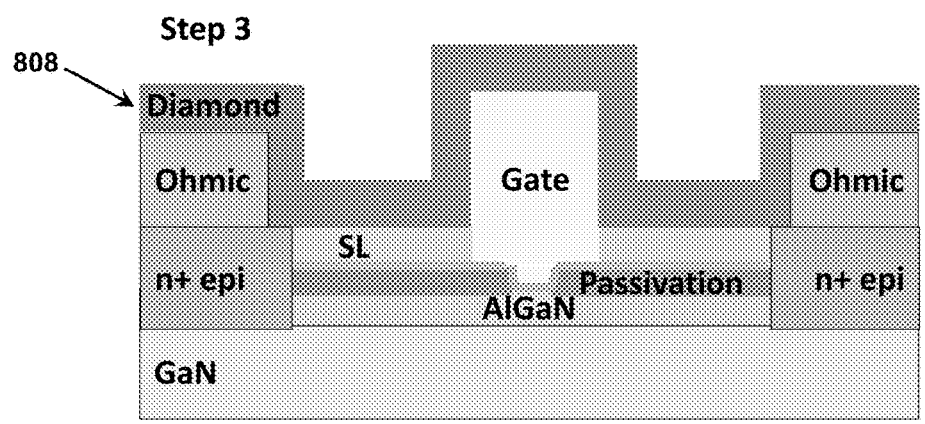
Figure 8D:
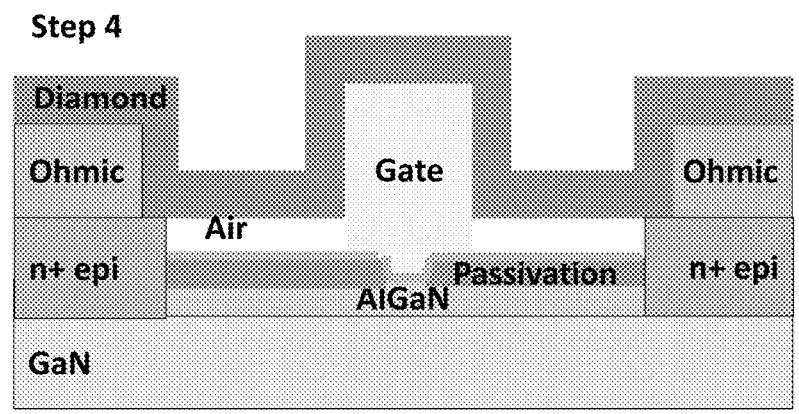

In Step 2 shown in FIG. 8B, SL 807 is deposited on an upper surface of the dielectric layer so as to extend along the sides of the n+ epi layers on either end of the device and along the sides of the gate. At Step 3 shown in FIG. 8C, diamond layer 808 is formed on all exposed surfaces of the device, covering the exposed upper surfaces and sides of the ohmic contacts, the n+ epi layer, the sacrificial layer, and the gate to encapsulate the entire upper surface of the device. Finally, at Step 4 shown in FIG. 8D, the sacrificial layer is removed, leaving the diamond deposited over the sacrificial layer suspended as an air bridge in the device.

Figure 9A:
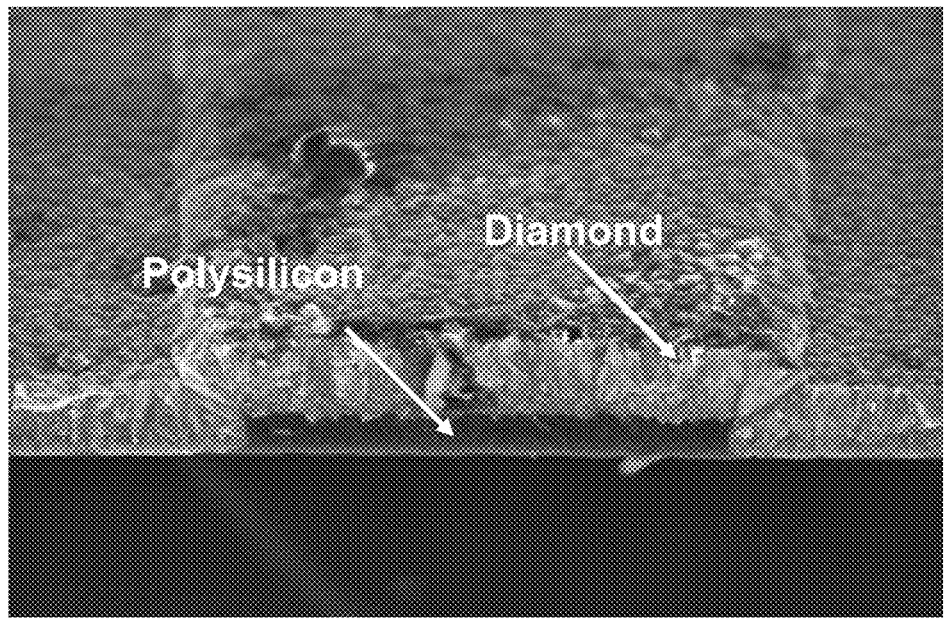
FIGS. 9A and 9B are SEM images showing aspects of a reduction to practice of the method of forming a diamond air bridge in accordance with the present invention.
Figure 9B:
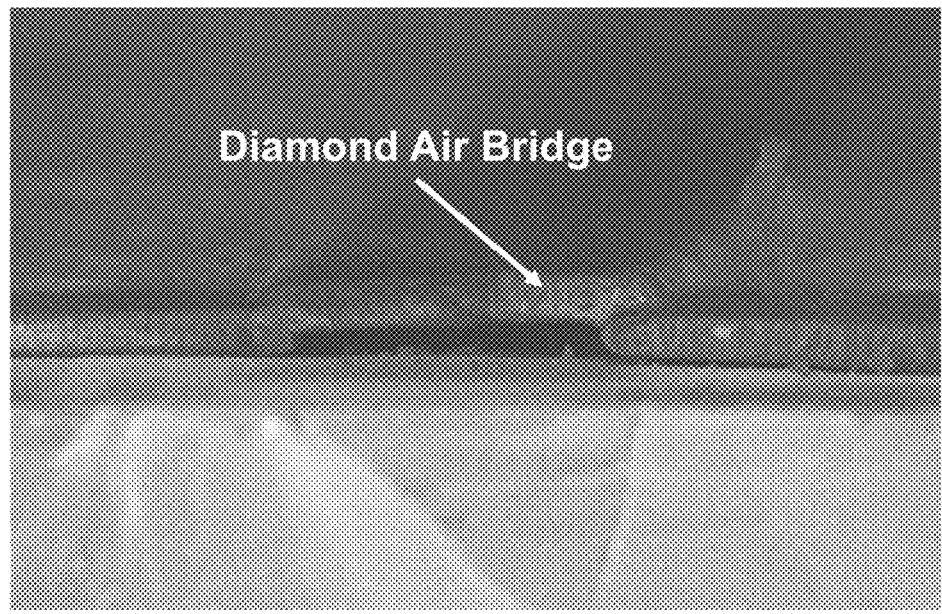

The concept of a diamond air bridge was reduced to practice as shown in FIGS. 9A and 9B. FIG. 9A shows a cross-sectional scanning electron microscope (SEM) image of a patterned polysilicon layer that has been coated with poly- or nano-crystalline diamond. The sample was sectioned prior to imaging. FIG. 9B shows the same sample after exposure to $XeF_2$, where the polysilicon is observed to have been etched leaving a suspended diamond air bridge.

Alternatives

In some alternative embodiments, the metal gate electrode can be replaced with diamond in any of the device structures described above.

The diamond air bridge of the present invention is not limited to implementation in an AlGaN/GaN HEMT. Other RF, microwave, or power switching transistors that can benefit from formation of a diamond air bridge in accordance with the present invention can include AlGaAs/GaAs HEMTs, InP based heterojunction bipolar transistors, Si/SiGe bipolar transistors, and laser diodes.

In some embodiments, the diamond material layer may be deposited at a temperature of about 400 C. In some embodiments, the diamond material layer may be deposited at temperatures of about 750 C. In some embodiments, the diamond material layer may be deposited at a temperature of about 1000 C.

In some embodiments, a high-temperature (>500° C.) diamond layer can deposited after formation of a Schottky gate, where the Schottky gate is formed from, e.g., a metal nitride, refractory metal, a metal alloy, titanium nitride, iridium, or copper material layer in contact with the III-nitride material or a first dielectric layer.

Advantages and New Features

The present invention provides a low capacitance, high thermal conductivity diamond air bridge that will enable high performance RF, microwave and power switching transistors. The advantage of the new approach is that by elevating the diamond thermal transport layer above the surface of the device, the dielectric constant that is responsible for capacitive coupling between the gate and the drain is reduced by a factor of approximately 6.

The diamond thin film layer produced in accordance with the present invention may improve lateral heat spreading locally in and near the active region of power dense microwave and millimeter wave devices. The diamond thin film layer will act to improve lateral heat spreading locally in and near the active region of power dense microwave and millimeter wave devices. The lateral heat spreading will increase the area for vertical heat transfer to the substrate. In addition, the lateral heat spreading can transfer the heat to thermal shunts built into the substrate. Because of the lateral heat spreading enable by the diamond thin film, there is reduced peak channel temperature and improved transistor reliability.

The embodiments described in this disclosure device and process provides for improved AlGaN/GaN HEMT pulse length and duty cycle as well as increased power switching capability and total RF, microwave and millimeter wave transistor output power and gain. The embodiments in this proposal also provide for reliable high temperature operation.

Silicon nitride has a dielectric constant of about 6.0 and diamond has a dielectric constant of about 5.5. The low dielectric constant of diamond material layers will reduce the gate-drain capacitance and the gate-to-source capacitance.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for fabricating an electronic device comprising:
   forming a GaN buffer layer on a substrate;
   forming an AlGaN barrier layer on an upper surface of the GaN buffer layer;
   depositing a passivation layer on an upper surface of the AlGaN barrier layer;
   patterning openings in the passivation layer and forming source, gate, and drain electrodes in the openings in the patterned passivation layer;
   depositing a sacrificial layer on the passivation layer and on upper surfaces of the source, gate, and drain electrodes;
   selectively etching the sacrificial layer so that the sacrificial layer remains only on an upper surface of the passivation layer between the source, gate, and drain electrodes;
   forming a diamond film on an upper surface of the sacrificial layer and on exposed upper surfaces of the source, gate, and drain electrodes;
   patterning the diamond film to expose portions of the source, gate, and drain electrodes so that electrical contact can be made to the device; and
   removing the remaining sacrificial layer from the upper surface of the passivation layer;
   wherein the diamond film forms a diamond air bridge suspended above the passivation layer by air pockets between the source and the gate and between the gate and the drain.

2. The method according to claim 1, further comprising depositing a gate insulator dielectric layer on the AlGaN barrier layer prior to formation of the gate.

3. A method for fabricating an electronic device comprising:
   forming a GaN buffer layer on a substrate;
   forming an AlGaN barrier layer on an upper surface of the GaN buffer layer;
   forming source and drain electrodes on an upper surface of the AlGaN barrier layer;
   depositing a passivation layer on the upper surface of the AlGaN barrier layer between the source and drain electrodes;
   depositing a sacrificial layer on an upper surface of the passivation layer;
   forming a diamond film on an upper surface of the sacrificial layer, the diamond layer further extending laterally to also cover upper surfaces of the source and drain electrodes;
   patterning the diamond film, the sacrificial layer, and the passivation layer to form an opening for formation of a gate electrode that extends to and contacts the AlGaN barrier layer, the gate electrode further extending laterally along an upper surface of the diamond layer; and
   removing the remaining sacrificial layer from the upper surface of the passivation layer, leaving the diamond film;
   wherein the diamond film forms a diamond air bridge suspended above the passivation layer by air pockets between the source and the gate and between the gate and the drain.

4. The method according to claim 3, further comprising depositing a gate insulator dielectric layer on the AlGaN barrier layer prior to formation of the gate.

5. A method for fabricating an electronic device comprising:
   forming a GaN buffer layer on a substrate;
   forming an AlGaN barrier layer on an upper surface of the GaN buffer layer;
   depositing a passivation layer on an upper surface of the AlGaN barrier layer;
   depositing a sacrificial layer on an upper surface of the passivation layer;
   forming a diamond film on an upper surface of the sacrificial layer;
   patterning the diamond film, the sacrificial layer, and the passivation layer to provide openings for source, gate, and drain electrodes and forming source, gate, and drain electrodes in the openings; and
   removing the remaining sacrificial layer from the upper surface of the passivation layer, leaving the diamond film;
   wherein the diamond film forms a diamond air bridge suspended above the passivation layer by air pockets between the source and the gate and between the gate and the drain.

6. A method for fabricating an electronic device comprising:
   forming a GaN buffer layer on a substrate;
   forming an AlGaN barrier layer on an upper surface of the GaN buffer layer;
   forming source, gate, and drain electrodes on an upper surface of the AlGaN barrier layer;
   depositing a passivation layer on the upper surface of the AlGaN barrier layer between the source and gate electrodes and between the gate and drain electrodes;
   depositing a sacrificial layer on the passivation layer between the source and gate electrodes and between the gate and drain electrodes, the sacrificial layer further extending onto and having a thickness sufficient to cover the upper surfaces of the source, gate, and drain electrodes;
   selectively etching the sacrificial layer to form openings for electrical contact in the source, gate, and drain electrodes, the sacrificial layer remaining in the unetched areas;
   forming a diamond film on an upper surface of the sacrificial layer and on the exposed upper surfaces of the source, gate, and drain electrodes; and
   removing the remaining sacrificial layer from the upper surface of the passivation layer, leaving the diamond film;
   wherein the diamond film forms a diamond air bridge suspended above the passivation layer by air pockets between the source and the gate and between the gate and the drain.

7. A method for fabricating an electronic device comprising:
   forming a GaN buffer layer on a substrate;
   forming an AlGaN barrier layer on an upper surface of the GaN buffer layer;
   forming an n+ epitaxial structure at each end of the AlGaN barrier layer;

forming an ohmic source electrode on one of the n+ epitaxial structures and an ohmic drain electrode on the other of the n+ epitaxial structures;

depositing a sacrificial layer on an upper surface of the AlGaN barrier layer and along the sides of the n+ epitaxial structures and the ohmic source and drain electrodes;

forming a diamond film on an upper surface of the sacrificial layer, the diamond layer further extending laterally to also cover an upper surface of the n+ epitaxial layer and the ohmic source and drain electrodes;

patterning the diamond film and the sacrificial layer to form a trench for a gate electrode that extends to the AlGaN barrier layer;

forming the gate electrode within the trench;

depositing a dielectric layer on an upper surface of the diamond film and on the diamond and sacrificial layers along the sides of the trench, the dielectric layer further extending along an exposed portion of the AlGaN barrier layer;

removing the remaining sacrificial layer from the upper surface of the passivation layer, leaving the diamond film, wherein the diamond film forms a diamond air bridge suspended above the AlGaN barrier layer by air pockets between the ohmic source and the gate and between the gate and the ohmic drain; and depositing a passivation layer on an upper surface of the dielectric layer, on the sides and upper surface of the gate electrode, and on the all surfaces of the structure surrounding the air pockets produced by removal of the sacrificial layer.

8. A method for fabricating an electronic device comprising:

forming a GaN buffer layer on a substrate;

forming an AlGaN barrier layer on an upper surface of the GaN buffer layer;

forming an n+ epitaxial structure at each end of the AlGaN barrier layer;

forming an ohmic source electrode on one of the n+ epitaxial structures and an ohmic drain electrode on the other of the n+ epitaxial structures;

depositing a sacrificial layer on an upper surface of the AlGaN barrier layer and along the sides and tops of the n+ epitaxial structures and the ohmic source and drain electrodes, the sacrificial layer being configured to leave a gap in the middle of the sacrificial layer so that a portion of the AlGaN barrier layer between the n+ epitaxial structures remains exposed;

forming a diamond film on an upper surface of the sacrificial layer and on the exposed surface of the AlGaN barrier layer, the diamond layer further extending laterally to also cover an upper surface of the n+ epitaxial structures and the ohmic source and drain electrodes;

patterning the diamond film and the sacrificial layer to form a trench for a gate electrode that extends to the AlGaN barrier layer;

depositing a dielectric layer on an upper surface of the diamond film and on the diamond and sacrificial layers along the sides of the trench, the dielectric layer further extending along an exposed portion of the AlGaN barrier layer;

forming a gate electrode within the trench, the gate electrode being configured to be both within the trench and to extend above an upper surface of the dielectric layer, a lower portion of the gate electrode being encased by both the diamond film and the dielectric layer;

removing the sacrificial layer from the upper surface of the AlGaN barrier layer and the upper surfaces of the n+ epi structures, wherein the diamond film forms a diamond air bridge suspended above the AlGaN barrier layer by air pockets between the ohmic source and the gate and between the ohmic gate and the drain; and depositing a passivation layer on an upper surface of the dielectric layer, on the sides and upper surface of the gate electrode, and on the all surfaces of the structure surrounding the air pockets produced by removal of the sacrificial layer.

9. A method for fabricating an electronic device comprising:

forming a GaN buffer layer on a substrate;

forming an AlGaN barrier layer on an upper surface of the GaN buffer layer;

forming an n+ epitaxial structure at each end of the AlGaN barrier layer;

forming an ohmic source electrode on one of the n+ epitaxial structures and an ohmic drain electrode on the other of the n+ epitaxial structures;

depositing a passivation layer on an upper surface of the AlGaN barrier layer, the passivation layer being patterned to form a trench therein, the trench extending to the upper surface of the AlGaN barrier layer;

depositing a dielectric layer on an upper surface of the passivation layer and along the sides and bottom of the trench;

forming a gate as a t-gate in the trench and on an upper surface of the dielectric layer, the gate being insulated from the AlGaN barrier layer by the dielectric layer in the trench;

depositing a sacrificial layer on an upper surface of the dielectric layer and along the sides and tops of the n+ epitaxial structures and the ohmic source and drain electrodes;

forming a diamond film on the exposed upper surfaces and sides of the ohmic source and drain contacts, the n+ epi structures, the sacrificial layer, and the gate so as to encapsulate the entire upper surface of the device; and removing the sacrificial layer from the upper surface of the dielectric layer and the upper surfaces of the n+ epi structures, wherein the diamond film forms a diamond air bridge suspended above the dielectric layer by air pockets between the ohmic source and the gate and between the ohmic gate and the drain.

* * * * *